(12) United States Patent
Ahlgren et al.

(10) Patent No.: US 7,466,010 B2
(45) Date of Patent: *Dec. 16, 2008

(54) BIPOLAR TRANSISTOR HAVING SELF-ALIGNED SILICIDE AND A SELF-ALIGNED EMITTER CONTACT BORDER

(75) Inventors: David C. Ahlgren, Wappingers Falls, NY (US); Gregory G. Freeman, Hopewell Junction, NY (US); Marwan H. Khater, Poughkeepsie, NY (US); Richard P. Volant, New Fairfield, CT (US)

(73) Assignee: International Business Machines Corporation, Armonk, NY (US)

( * ) Notice: Subject to any disclaimer, the term of this patent is extended or adjusted under 35 U.S.C. 154(b) by 314 days.

This patent is subject to a terminal disclaimer.

(21) Appl. No.: 11/175,094

(22) Filed: Jul. 5, 2005

(65) Prior Publication Data

US 2005/0242373 A1  Nov. 3, 2005

Related U.S. Application Data

(62) Division of application No. 10/727,945, filed on Dec. 4, 2003, now Pat. No. 6,979,884.

(51) Int. Cl.
*H01L 27/082* (2006.01)
*H01L 27/102* (2006.01)
*H01L 29/70* (2006.01)
*H01L 31/11* (2006.01)

(52) U.S. Cl. .................. 257/584; 257/587; 257/588; 257/592

(58) Field of Classification Search ............ 257/565, 257/586–588, 576, 578, 583–584, 592
See application file for complete search history.

(56) References Cited

U.S. PATENT DOCUMENTS

| | | | |
|---|---|---|---|
| 5,198,689 | A | 3/1993 | Fujioka |
| 6,177,717 | B1 | 1/2001 | Chantre et al. |
| 6,248,650 | B1 | 6/2001 | Johnson |
| 6,399,993 | B1 | 6/2002 | Ohnishi et al. |
| 6,767,798 | B2 | 7/2004 | Kalnitsky et al. |
| 6,979,884 | B2 * | 12/2005 | Ahlgren et al. ............ 257/588 |
| 2002/0158311 | A1 | 10/2002 | Ohnishi et al. |
| 2002/0168829 | A1 | 11/2002 | Bock et al. |
| 2003/0193077 | A1 | 10/2003 | Fujii |
| 2003/0227071 | A1 | 12/2003 | Chen |

* cited by examiner

*Primary Examiner*—Shouxiang Hu
(74) *Attorney, Agent, or Firm*—Scully, Scott, Murphy & Presser, P.C.; Todd M. C. Li, Esq.

(57) ABSTRACT

The present invention provides a bipolar transistor having a raised extrinsic base silicide and an emitter contact border that are self-aligned. The bipolar transistor of the present invention exhibit reduced parasitics as compared with bipolar transistors that do not include a self-aligned silicide and a self-aligned emitter contact border. The present invention also is related to methods of fabricating the inventive bipolar transistor structure. In the methods of the present invention, a block emitter polysilicon region replaces a conventional T-shaped emitter polysilicon.

12 Claims, 25 Drawing Sheets

BIPOLAR TRANSISTOR HAVING SELF-ALIGNED SILICIDE AND A SELF-ALIGNED EMITTER CONTACT BORDER

RELATED APPLICATIONS

This application is a divisional of U.S. application Ser. No. 10/727,945, filed Dec. 4, 2003 now U.S. Pat. No. 6,979,884.

FIELD OF THE INVENTION

The present invention relates to bipolar transistors, and more particularly to a bipolar transistor having a raised extrinsic base with a silicide region and an emitter contact border that are self-aligned to the emitter. The bipolar transistor of the present invention exhibits reduced parasitics as compared with a bipolar transistor that does not include a self-aligned silicide and a self-aligned emitter contact border. The present invention also relates to various methods of fabricating a bipolar transistor structure having a raised extrinsic base with a silicide region and an emitter contact border that are self-aligned to the emitter.

BACKGROUND OF THE INVENTION

Cut-off frequency ($f_T$) and maximum oscillation frequency ($f_{max}$) are the most representative measures of operation speed for high-speed transistors. Hence, the design and optimization efforts for high-speed transistors are mostly directed towards maximization of the aforementioned parameters. As the emitter dimension is shrinking to improve bipolar transistor performance, the parasitic resistance and capacitance are becoming larger and more significant in determining the transistor operation speed, i.e., $f_T$ and $f_{max}$.

For a small emitter, the emitter contact dimension needs to be large to maintain low contact resistance and high current operation capability. As a result, the emitter contact area needs to be defined by a lithographic level of dimension X, as shown in FIG. 1, which is larger than the emitter dimension; FIG. 1 is a cross-sectional view of a bipolar transistor that is made using a prior art process. This results in a T-shaped emitter with excess top regions of dimension Y that prevents the raised extrinsic base silicide edge from being extended closer and self-aligned to the emitter edge and increases the overlap area between the emitter and the extrinsic base.

The limitation of extending the silicide closer to the emitter leads to high base resistance (Rb). More specifically, the current has to traverse the polysilicon diagonally to reach the silicide edge, which results in a high base resistance due to its component Rb(poly) of the non-silicided polysilicon, as shown in FIG. 1. Rb(poly) can be as high as 36% of the total base resistance. In addition, the excess top regions of the emitter result in a higher emitter-to-base capacitance (Ceb) due to the additional component Ceb (TEOS) across the isolation TEOS as shown in FIG. 1.

In view of the drawbacks mentioned with prior art bipolar transistors, there is a need for developing a new and improved bipolar transistor in which resistance and capacitance have been substantially reduced in order to improve the transistor high-speed performance.

SUMMARY OF THE INVENTION

An object of the present invention is to provide a high performance bipolar transistor in which the cut-off frequency ($f_T$) and maximum oscillation frequency ($f_{max}$) have been optimized.

A further object of the present invention is to provide a bipolar transistor wherein the parasitic resistance and capacitance have been substantially reduced.

A still further object of the present invention is to provide a bipolar transistor in which the extrinsic base silicide is positioned in a self-aligned manner with respect to the emitter.

A yet further object of the present invention is to provide a bipolar transistor in which the polysilicon component of the base resistance Rb(poly) is significantly reduced.

An even further object of the present invention is to provide a bipolar transistor in which the emitter contact border is defined in a self-aligned manner with a spacer or double spacer.

These and other objects and advantages are achieved in the present invention by forming a bipolar transistor in which the emitter region is in the form of a block rather than a T-shape, as is the case with the prior art (see FIG. 1). A block emitter region allows the extrinsic base silicide to be formed in a self-aligned manner with respect to the emitter. In this manner, the polysilicon component of the base resistance Rb(poly) is significantly reduced since the current traverses the polysilicon vertically to reach the silicide edge.

In addition, a block emitter region eliminates the emitter-to-base parasitic capacitance component across the isolation oxide Ceb (TEOS) as shown in FIG. 1. Moreover, in the present invention, the block emitter region can be silicided to further reduce the emitter resistance Re.

Another benefit of providing a bipolar transistor with a block emitter region is that the emitter contact border can be defined in a self-aligned manner with a spacer or double spacer. Furthermore, the self-aligned emitter contact border provided by the present invention has the same dimension as that for the contact defined by lithography in the prior art process (see FIG. 1).

This is critical since the spacer acts as an etch stop layer during an etching step to prevent exposing the extrinsic base region in the emitter contact opening (CE), which can be larger in dimension than the emitter during the reactive-ion etching (RIE) process of the contact openings. Furthermore, the spacer provides electrical isolation between the emitter and the base in place of the isolation oxide in the prior art as shown in FIG. 1. In this case, the silicide can be performed in a self-aligned manner with shrinking emitter dimension while the emitter contact dimension remains the same. The method of the present invention achieves the above, while saving a lithographic mask by forming the emitter contact border in a self-aligned manner.

A first aspect of the present invention relates to a bipolar transistor that has self-aligned suicides (located on the raised extrinsic base regions and in the block polysilicon emitter region) and a self-aligned emitter contact border. Specifically, and in broad terms, the bipolar transistor of the present invention comprises:

a base region comprising an intrinsic base region and surrounding raised extrinsic base regions;

a block polysilicon emitter region located atop and in contact with said intrinsic base region;

a first silicide layer located on the raised extrinsic base region, said first silicide layer having an inner edge that is self-aligned to the block polysilicon emitter region;

a second silicide layer located in the block polysilicon emitter region, said second silicide layer is self-aligned to the first silicide layer; and a self-aligned emitter contact border located atop the raised extrinsic base region.

In the first aspect of the present invention, the second silicide layer that is located in the block polysilicon emitter region can be either located atop a polysilicon emitter or inside the emitter region, atop a thin conformal polysilicon emitter.

In this first aspect of the present invention, the self-aligned emitter contact border is defined by a single wide spacer that is located atop a portion of the raised extrinsic base region, adjacent to the block polysilicon emitter region.

In another embodiment of the first aspect of the present invention, the self-aligned emitter contact border is defined by a double spacer that is located atop a portion of the raised extrinsic base region, adjacent to the block polysilicon emitter region.

In some embodiments of the first aspect of the present invention, the block polysilicon emitter region includes an emitter opening that includes a non-recessed polysilicon emitter.

In still another embodiment of the first aspect of the present invention, the block polysilicon emitter region includes a conformal polysilicon layer that is located on sidewalls within the emitter opening.

In a second aspect of the present invention, a bipolar transistor that has a self-aligned silicide located on the raised extrinsic base regions and a self-aligned emitter contact border is provided. Specifically, and in broad terms, the bipolar transistor of the present invention comprises:

a base region comprising an intrinsic base region and surrounding raised extrinsic base regions;

a block polysilicon emitter region located atop and in contact with said intrinsic base region;

a first silicide layer located on the raised extrinsic base region, said silicide layer having an inner edge that is self-aligned to the block polysilicon emitter region; and a self-aligned emitter contact border located atop the raised extrinsic base region.

In the second aspect of the present invention, the block polysilicon emitter region includes a polysilicon emitter that has an upper surface that is recessed. In this embodiment, a metal plug, or the emitter contact itself is formed at least atop the recessed polysilicon emitter. No second silicide layer is present within the block polysilicon emitter region.

In this second aspect of the present invention, the self-aligned emitter contact border is defined by a single wide spacer that is located atop a portion of the raised extrinsic base region, adjacent to the block polysilicon emitter region.

In another embodiment of the second aspect of the present invention, the self-aligned emitter contact border is defined by a double spacer that is located atop a portion of the raised extrinsic base region, adjacent to the block polysilicon emitter region.

A third aspect of the present invention relates to a method of fabricating a bipolar transistor having self-aligned silicides and a self-aligned emitter contact border. In board terms, the method of the present invention comprises:

forming an emitter opening in a raised extrinsic base/dielectric stack, said emitter opening having an insulating spacer therein that defines the emitter's final dimension and provides lateral emitter-base isolation;

providing a block polysilicon emitter region in said emitter opening;

removing said dielectric to expose said raised extrinsic base;

patterning said exposed raised extrinsic base;

forming a first silicide layer on at least said patterned raised extrinsic base, said first silicide layer having an inner edge that is self-aligned to the block polysilicon emitter region; and forming a self-aligned emitter contact border atop a portion of the patterned raised extrinsic base.

In one embodiment of the present invention, the self-aligned emitter contact border is formed by a single wide spacer that is located atop a portion of the patterned raised extrinsic base, adjacent to the block polysilicon emitter region.

In another embodiment of the present invention, the self-aligned emitter contact border is defined by a double spacer that is located atop a portion of the patterned raised extrinsic base, adjacent to the block polysilicon emitter region.

In some embodiments of the present invention, the block polysilicon emitter region includes a polysilicon emitter that has an upper surface that is coplanar with an upper surface of the raised extrinsic base/dielectric stack. In this embodiment, the upper surface of the emitter polysilicon is above the upper surface of the raised extrinsic base.

In yet another embodiment of the present invention, the block polysilicon emitter region includes a polysilicon emitter that has an upper surface that is recessed below an upper surface of the raised extrinsic base/dielectric stack. Specifically, the upper surface of the recessed polysilicon emitter is below an upper surface of the raised extrinsic base. In this embodiment, a metal plug, or the emitter contact itself is formed at least atop the recessed polysilicon emitter.

In still another embodiment of the present invention, the block polysilicon emitter region includes a conformal polysilicon layer that is formed on sidewalls within the opening.

DETAILED DESCRIPTION OF THE INVENTION

Figure 1:
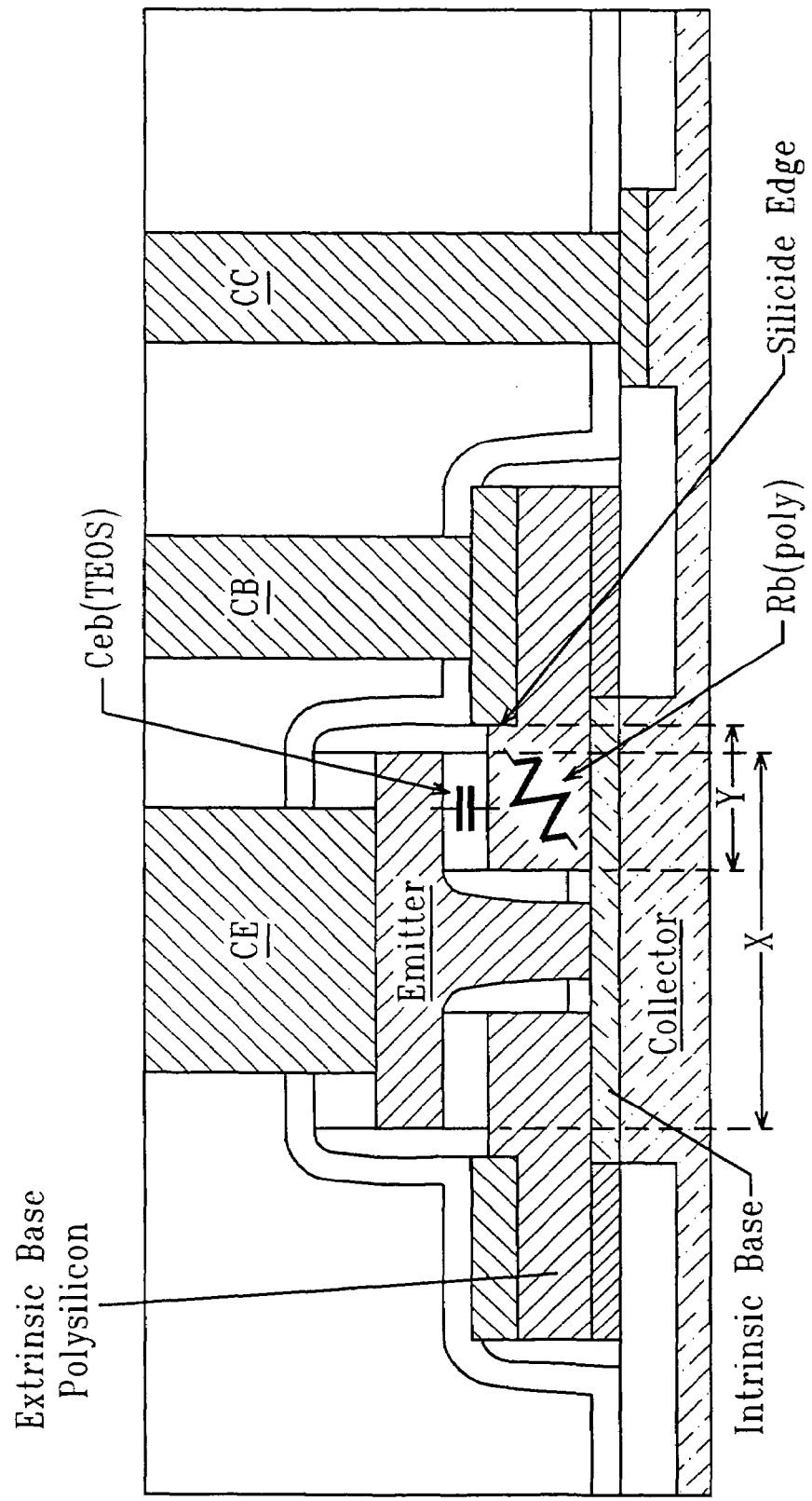
FIG. 1 is a pictorial representation (through a cross sectional view) showing a prior art bipolar transistor having a T-shaped emitter region.

The present invention, which provides bipolar transistors having self-aligned silicides and self-aligned emitter contact border as well as methods of fabricating the same, will now be described in greater detail by referring to the drawings that accompany the present application. In the accompanying drawings, like and/or corresponding elements are referred to by like reference numerals.

The drawings of the present application illustrate only the heterojunction bipolar transistor (HBT) area. For clarity, the CMOS device areas as well as other areas of a typical BiCMOS structure are not shown in drawings. These other areas not shown lay to the periphery of the HBT area shown. Additionally, although a single HBT device area is shown, the present invention can be used in forming a plurality of HBTs on top of a single substrate.

Reference is first made to FIGS. 2A-2H which illustrate a first embodiment of the present invention. In this embodiment, a block polysilicon emitter region including a polysilicon emitter that is coplanar with the initial raised extrinsic base/dielectric stack is used in forming a bipolar transistor having self-aligned silicides and a self-aligned emitter contact border. The first embodiment of the present invention includes first providing the partial bipolar transistor structure 10 shown in FIG. 2A. The partial bipolar transistor structure 10 of FIG. 2A comprises a Si-containing substrate 12 having isolation regions 14 formed therein.

The Si-containing substrate 12 may include any semiconductor material that includes silicon. Examples of Si-containing substrates 12 that can be employed in the present invention include, but are not limited to: Si, SiGe, SiGeC, SiC, silicon-on-insulators, or SiGe-on-insulators. Alternatively, the Si-containing substrate 12 may include a stack structure wherein a Si layer such as epi-Si or amorphous Si is formed atop a semiconductor substrate. The Si-containing substrate 12 may include various doping or well regions. The Si-containing substrate 12 may also include a collector region 18 and a collector reach-through region 16.

The isolation regions 14 may be trench isolation regions as shown, or alternatively the isolation regions 14 may be field oxide regions. When trench isolation regions are employed, the trench isolation regions are formed using techniques well known to those skilled in the art including, for example, lithography, etching, optionally forming a liner, trench filling and planarization. The trench fill includes a dielectric such as a high-density oxide or tetraethylorthosilicate (TEOS). When field oxide isolation regions are used, a local oxidation of silicon process can be used in forming those types of isolation regions.

The partial bipolar transistor structure 10 also includes a patterned protective material 20 such as an oxide, nitride, oxynitride or any combinations thereof located atop selected portions of the HBT device area. The patterned protective material 20 is formed utilizing deposition or thermal growing, lithography and etching. Of the various materials mentioned above, it is preferred that the patterned protective material 20 is comprised of an oxide.

Figure 2A:
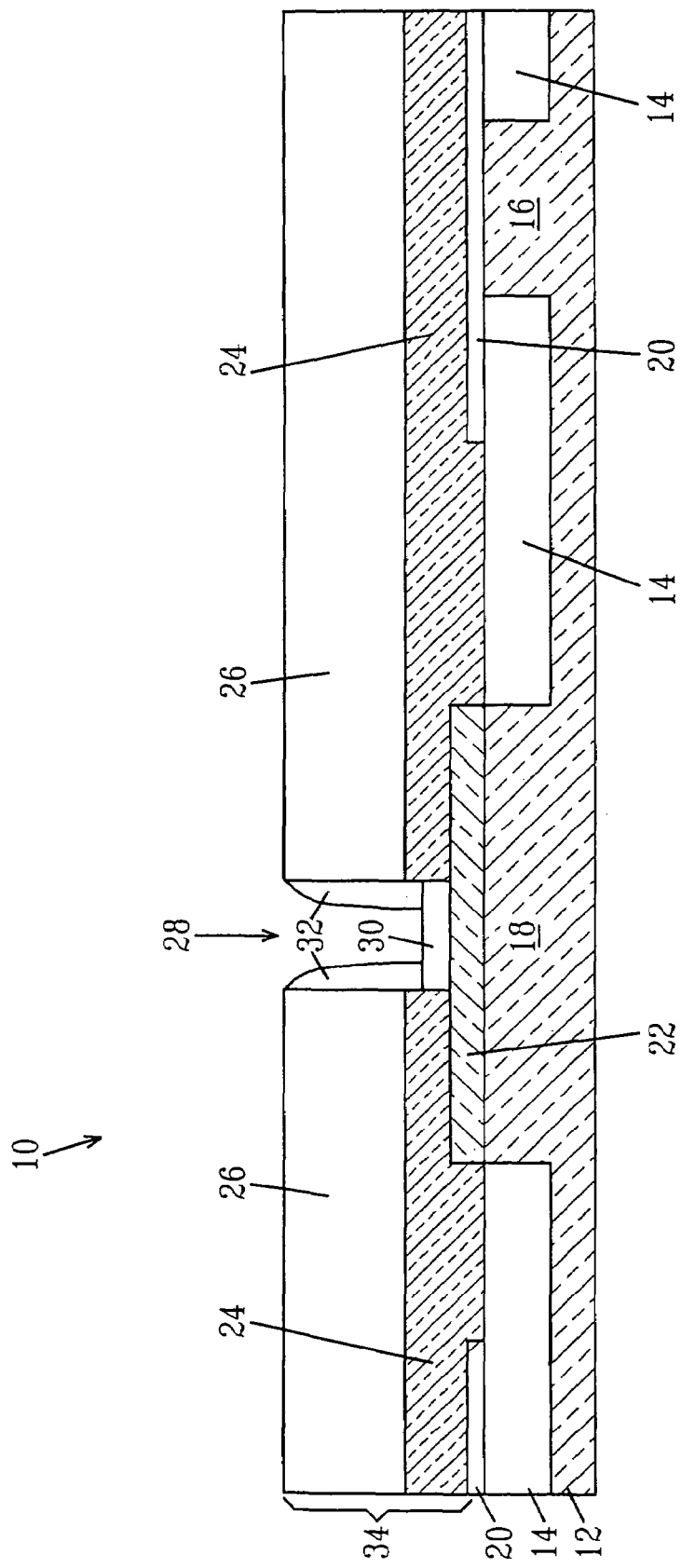
FIGS. 2A-2H are pictorial representations (through cross sectional views) showing the processing steps that are employed in fabricating a bipolar transistor in accordance with a first embodiment of the present invention.

In addition, the partial bipolar transistor structure 10 shown in FIG. 2A also includes a base region that comprises intrinsic base portion 22 and surrounding raised extrinsic base layer 24. The base region is formed using a low-temperature epitaxial growth process that is typically performed at a temperature from about 450° to about 700° C. The intrinsic base 22 may comprise Si, SiGe or a combination of Si and Ge. The intrinsic base portion 22 is typically monocrystalline, while the extrinsic base layer 24 is typically polycrystalline Si or SiGe.

The partial bipolar transistor structure 10 also includes an emitter opening 28 that is formed within dielectric layer 26 and raised extrinsic base layer 24. Within the emitter opening is shown an oxide layer 30 and annular insulating spacer 32. The dielectric layer 26 is composed of an oxide, nitride, or oxynitride. Of the foregoing dielectric materials, it is preferred that dielectric layer 26 is an oxide. The insulating spacer 32 is comprised of a dielectric, such as nitride or oxide.

In accordance with the present invention, the dielectric layer 26 and the underlying extrinsic base layer 24 form a raised extrinsic base/dielectric stack. In FIG. 2A, reference numeral 34 denoted the raised extrinsic base/dielectric stack.

The insulating spacer 32 is employed in the present invention to define the final dimension of the emitter and to provide lateral emitter-base isolation.

Portions of the oxide layer 30 that are not protected by insulating spacer 32 is then removed utilizing a selective etching process to provide a direct opening to the underlying intrinsic base 22. After providing the direct opening to the intrinsic base 22, a polysilicon emitter 36 is then formed over dielectric layer 26 and within the emitter opening 28 by a conventional in-situ doping deposition process or deposition followed by ion implantation. The resultant structure including the polysilicon emitter 36 is shown in FIG. 2B.

Figure 2B:
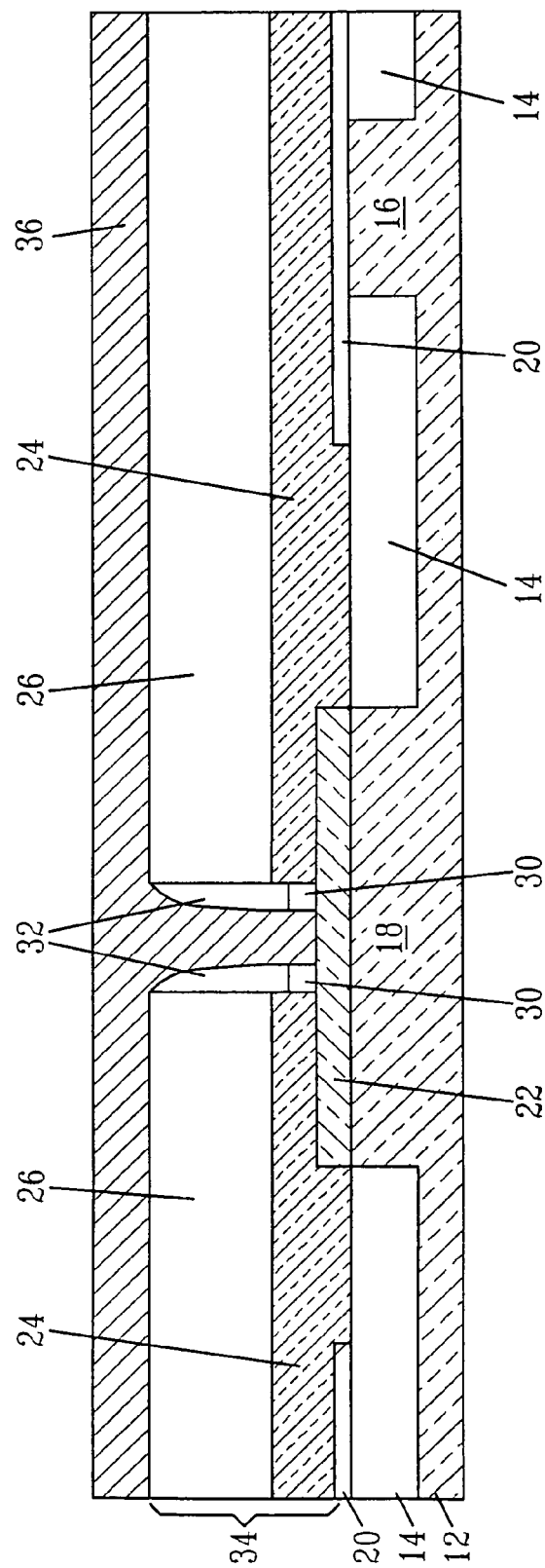
Figure 2C:
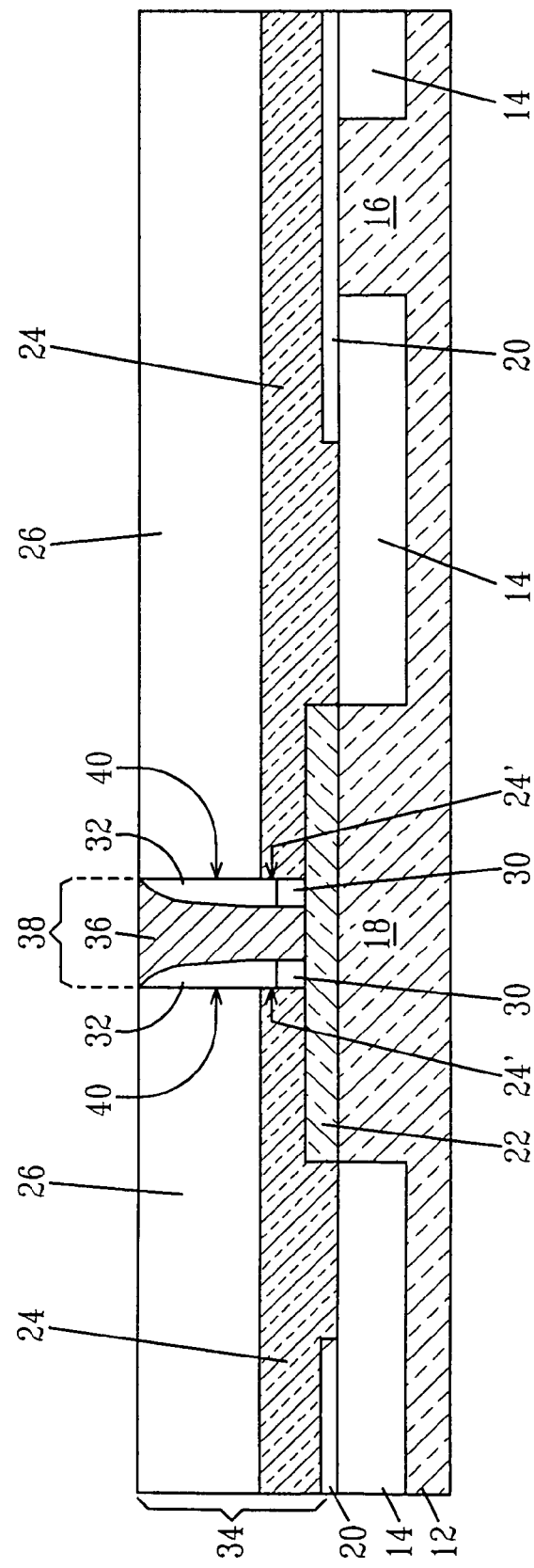

Next, and as shown in FIG. 2C, the polysilicon emitter 36 shown in FIG. 2B is subjected to a conventional planarization process such as chemical mechanical polishing (CMP). Alternatively, a reactive ion etch (RIE) back processing step may be used in forming the structure shown in FIG. 2C. In this embodiment of the present invention, the planarization or RIE etch back process is stopped when the upper surface of the dielectric layer 26 is reached. Thus, polysilicon emitter 36 has an upper surface that is coplanar with the upper surface of the dielectric layer 26. It is noted that in FIG. 2C a block polysilicon emitter region is formed. The block polysilicon emitter region is labeled as reference numeral 38 in FIG. 2C.

In this embodiment of the present invention, the block polysilicon emitter region 38 includes planarized polysilicon emitter 36, insulating spacer 32 and non-etched portions of oxide layer 30. The block polysilicon emitter region 38 has outer sidewall 40 that are in contact with the inner edge 24' of raised extrinsic base layer 24.

Figure 2D:
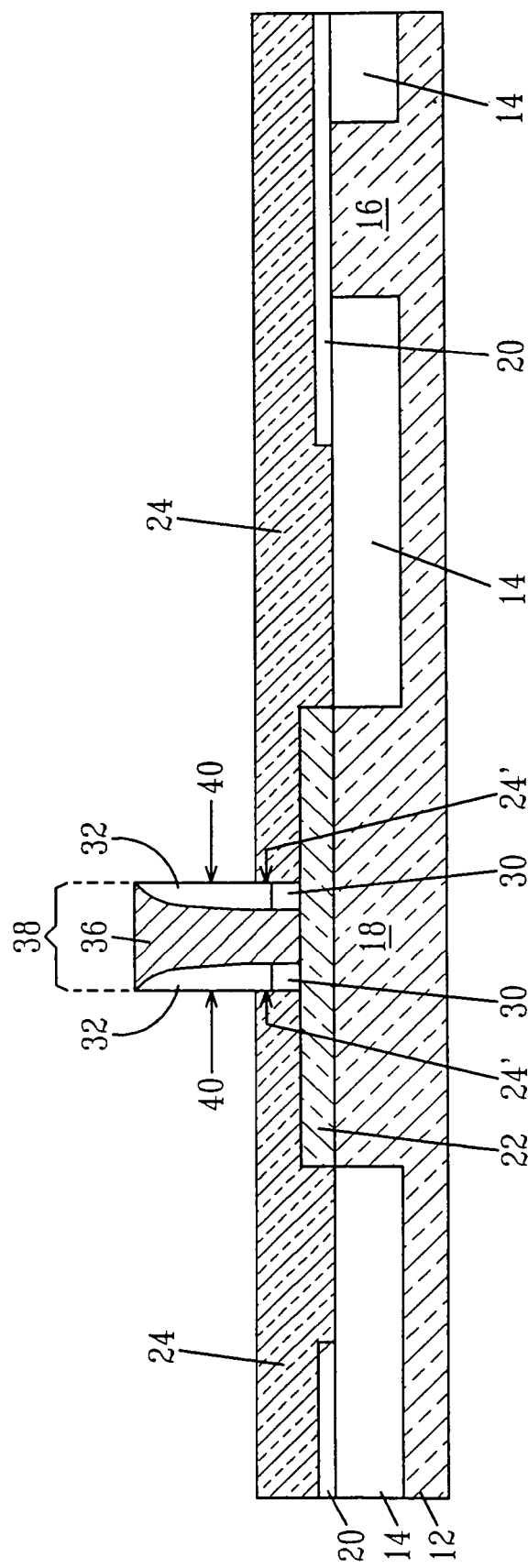

The dielectric layer 26 is then removed from the structure utilizing an etching process that selectively removes oxide as compared to polysilicon or nitride providing the structure shown in FIG. 2D. The removal process stops atop an upper surface of the raised extrinsic base layer 24.

Figure 2E:
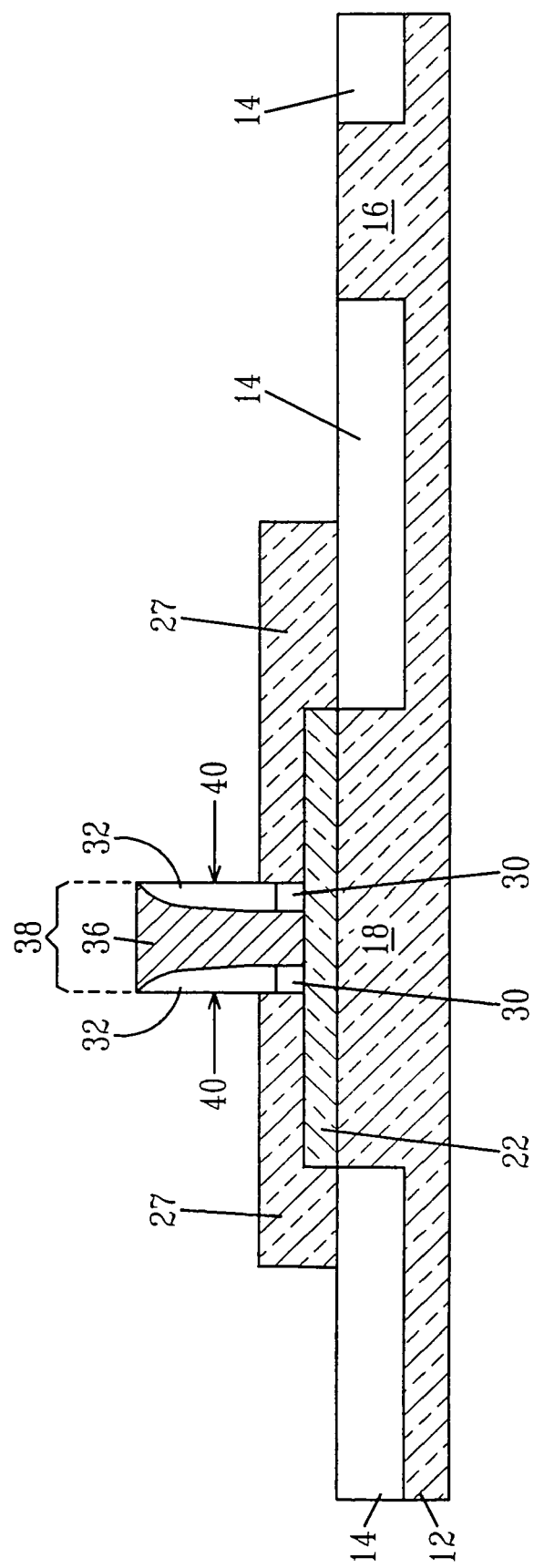

Next, the raised extrinsic base layer 24 is patterned by lithography and reactive ion etching to define a raised extrinsic base region 27. After the patterning step, the patterned protective material 20 is removed utilizing an etching process that selectively removes the patterned protective material 20. The resultant structure including raised extrinsic base region 27 is shown in FIG. 2E.

Figure 2F:
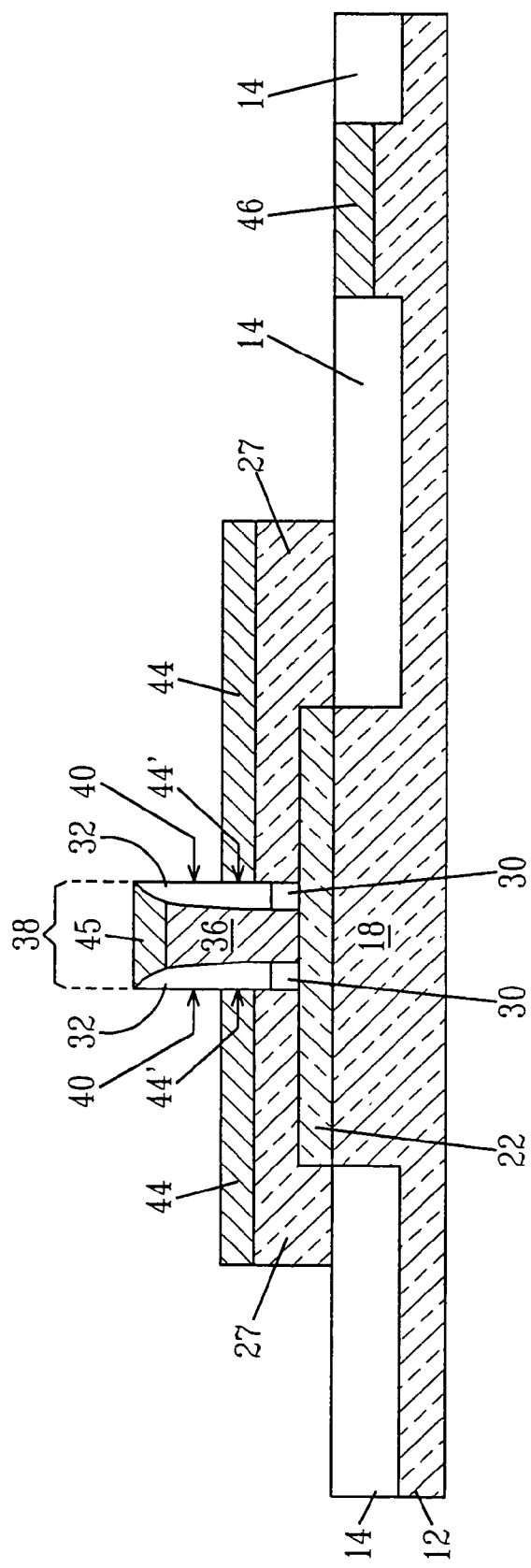

Silicide layers 44 and 45 are then formed over the exposed portions of the raised extrinsic base region 27 and the upper surface of the polysilicon emitter 36, respectively utilizing a conventional silicidation process that includes deposition of a metal silicide such as Ni, Pt, Co, or Ti, and annealing. In this case, the overall resistance of the emitter is reduced by the silicide layer 45. As shown in FIG. 2F, the first silicide layer 44 atop the extrinsic base region 27 has an inner edge 44' that is self-aligned to the edge 40 of the block polysilicon emitter region 38. The second silicide layer 45 is self-aligned with the first silicide layer 44. Note also that a third silicide region 46 is also formed atop the exposed semiconductor substrate 12 in collector reach-through region 16 as well.

Figure 2G:
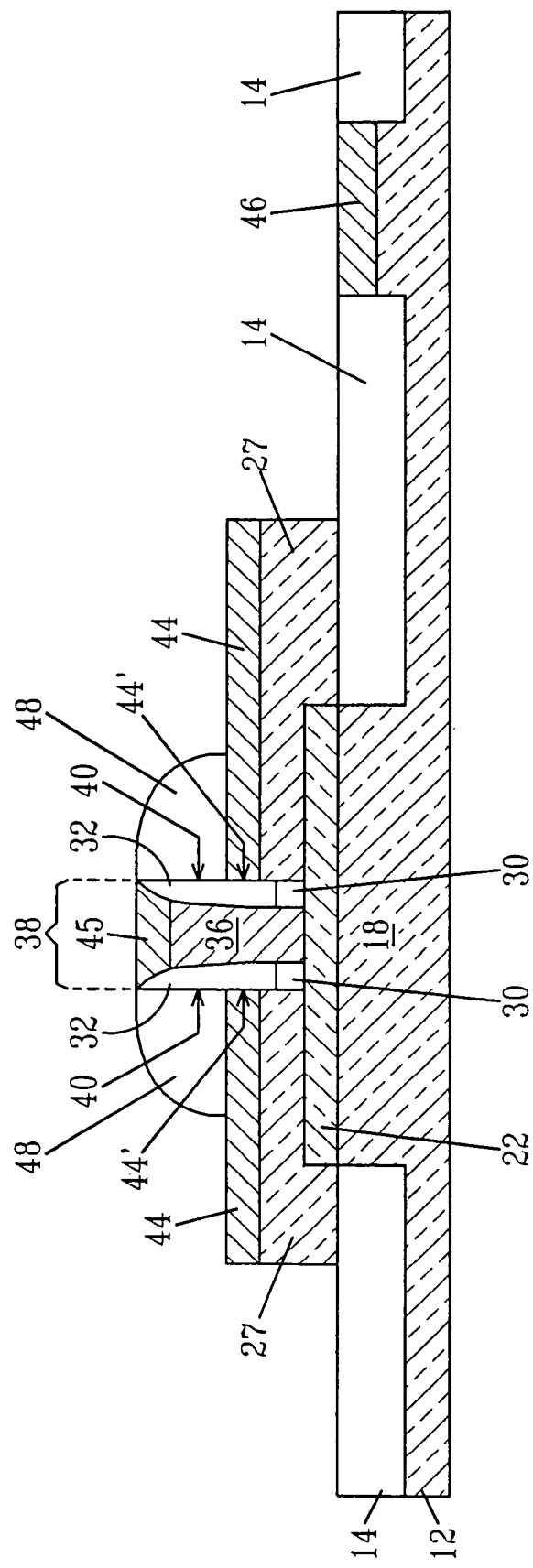

FIG. 2G shows the formation of the emitter contact border in a self-aligned manner to the emitter block by forming a wide spacer 48. As shown, the emitter contact border, i.e., wide spacer 48, is located atop portions of the raised extrinsic base region 27 and it is self-aligned to the edge of the block polysilicon emitter region 38. The wide spacer 48, which is typically an oxide, is formed by deposition and etching. The wide spacer 48 is formed adjacent to edge 40 of block polysilicon emitter region 38 as well as atop the silicide layer 44.

Figure 2H:
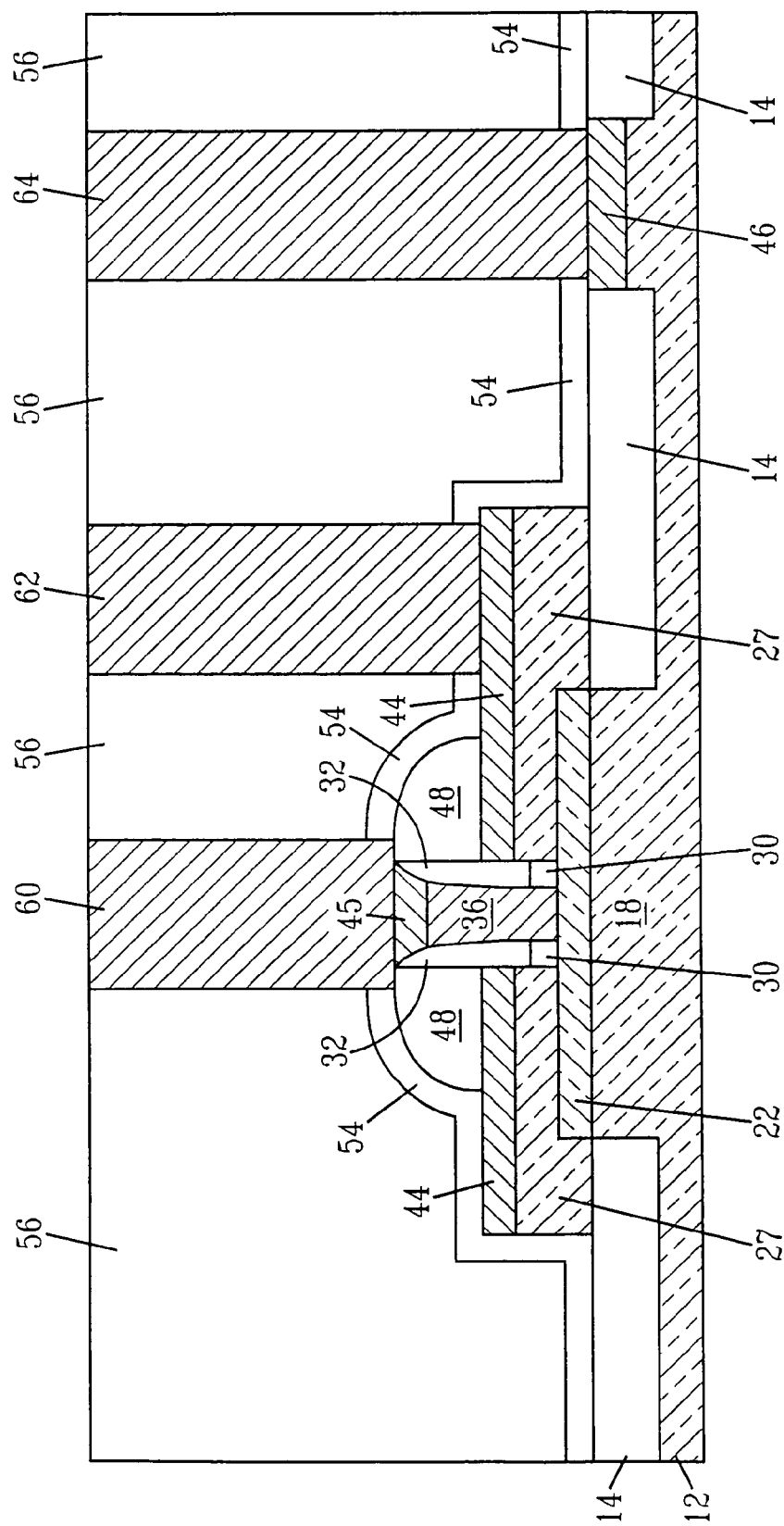

FIG. 2H shows the structure after deposition, planarization of a dielectric stack that includes nitride layer 54 and doped silicate glass layer 56, and contact formation. The doped silicate glass may include boron doped silicate glass, phosphorus doped silicate glass, or boron-phosphorous doped silicate glass. The deposition and planarization includes techniques that are well known in the art. The contact formation includes lithography, etching, deposition of a contact metal such as W, Ti, Cu, Ta, and the like and planarization. The various contacts formed during this point of the present invention are labeled as 60, 62 and 64 in FIG. 2H. Contact 60 represents the emitter contact, contact 62 denotes the base contact, and 64 denotes the collector contact. In the present invention, the emitter contact 60 has a dimension that is larger than the dimension of the block polysilicon emitter region 38.

Specifically, FIG. 2H shows the basic bipolar transistor structure of the present invention. As shown, the bipolar transistor structure includes a base region comprising an intrinsic base region 22 and surrounding raised extrinsic base regions 27. A block polysilicon emitter region 38 comprising a polysilicon emitter 36 and silicide layer 45 is located atop and in contact with the base region; particularly the polysilicon emitter 36 is in direct contact with the intrinsic base region 22. The polysilicon emitter 36 is isolated from the raised extrinsic base region 27 by oxide 30 and spacer 32. A silicide layer 44 is located on the raised extrinsic base region 27. An inner edge of the silicide layer 44 is self-aligned to the block polysilicon emitter region 38. Silicide 45 is also self-aligned to the first silicide layer 44. The structure also includes an emitter contact border, which is in the form of a wide spacer 48, located atop the patterned raised extrinsic base region 27. The emitter contact border is self-aligned to the edge of the block polysilicon emitter region 38. Spacer 48 has a sufficient width to provide emitter-base isolation with an emitter contact 60 having a dimension wider than that of the polysilicon emitter 36.

Figure 3:
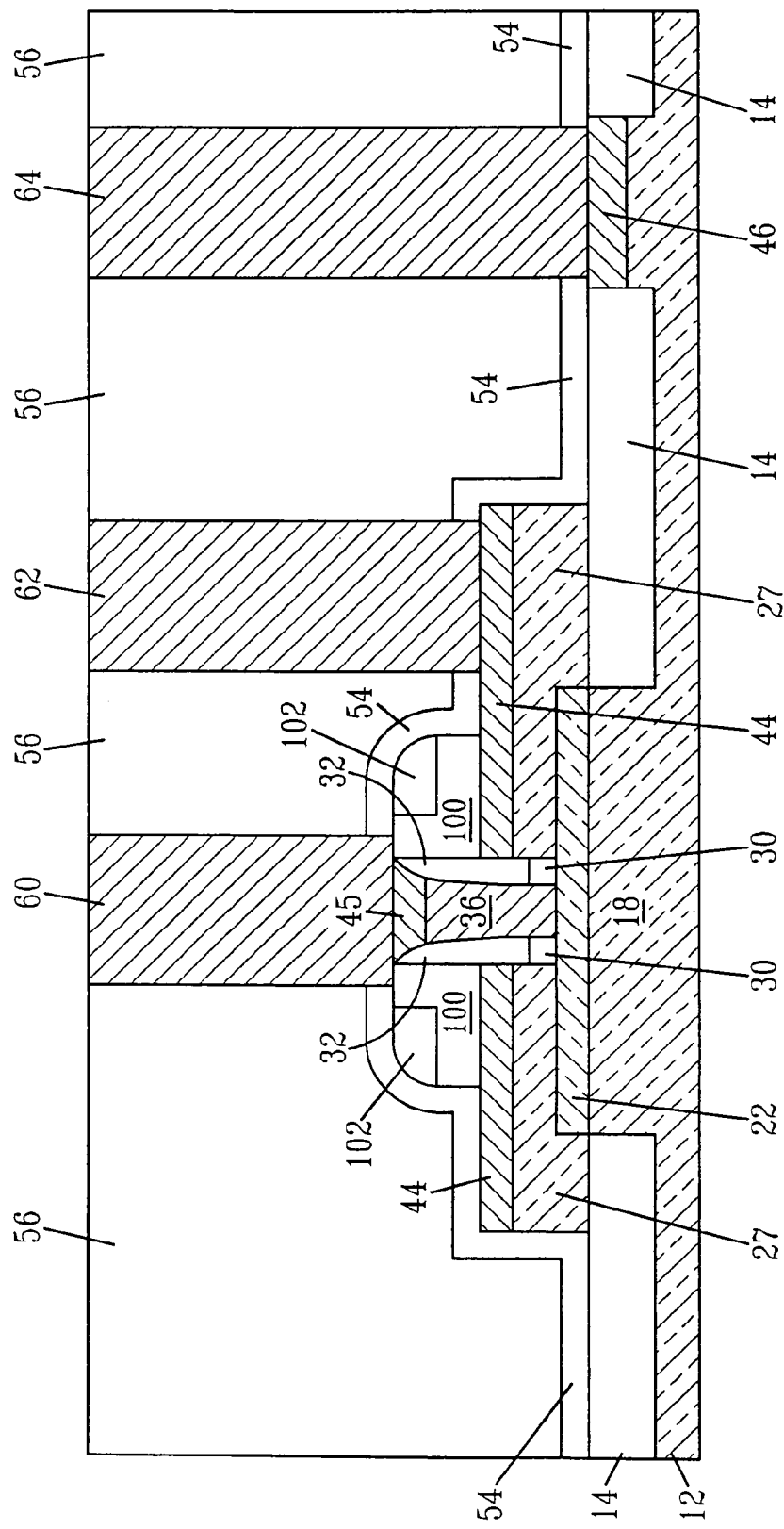
FIG. 3 is a pictorial representation (through a cross sectional view) showing a bipolar transistor in accordance with a second embodiment of the present invention.

FIG. 3 shows a second embodiment of the present invention in which the single wide spacer 48 employed in FIGS. 2A-2H is replaced with a double spacer. The double spacer includes L-shaped inner spacer 100 and outer spacer 102. The double spacer is formed by deposition of a first conformal dielectric layer, deposition and RIE etch of a second dielectric layer to form spacer 102, and RIE etch of first dielectric layer to form L-shaped spacer 100. The double spacer is formed at the same point of the present invention in making the embodiment in FIG. 3 in place of the wide spacer 48 of the embodiment in FIG. 2H. All other processing steps are the same as in the first embodiment of the present invention.

Specifically, FIG. 3 shows another bipolar transistor structure of the present invention. As shown, the bipolar transistor structure includes a base region comprising an intrinsic base region 22 and surrounding raised extrinsic base region 27. A block polysilicon emitter region 38 comprising a polysilicon emitter 36 and self-aligned silicide layer 45 is located atop and in contact with the base region; particularly the polysilicon emitter 36 is in direct contact with the intrinsic base region 22. The polysilicon emitter 36 is isolated from the raised extrinsic base regions by oxide 30 and spacer 32. A silicide layer 44 is located on the raised extrinsic base region 27. An inner edge of the silicide layer 44 is self-aligned to the block polysilicon emitter region 38. The structure also includes an emitter contact border, which is in the form of a double spacer comprising spacers 100 and 102, located atop the patterned raised extrinsic base region 27. The emitter contact border is self-aligned to the edge of the block polysilicon emitter region 38.

Figure 4A:
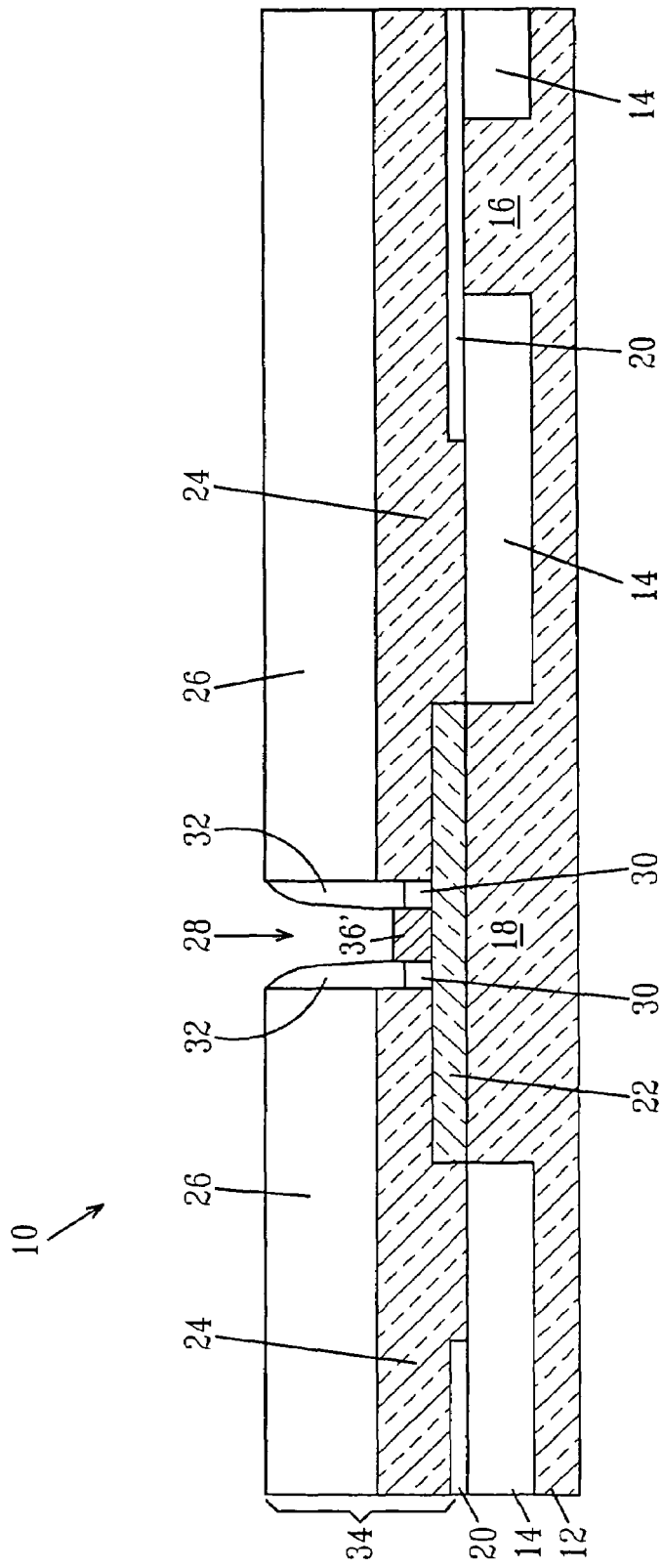
FIGS. 4A-4D are pictorial representations (through cross sectional views) illustrating a third embodiment of the present invention.

FIGS. 4A-4D show a third embodiment of the present invention. In the third embodiment, a recessed emitter polysilicon and a metallic plug replace the polysilicon emitter 36 described in the first embodiment (see FIG. 2C). In the third embodiment, the processing steps used in forming the structure shown in FIG. 2B are first performed. The polysilicon emitter 36 is then recessed below the upper surface of the patterned dielectric layer 26 utilizing a reactive ion etch step or chemical mechanical polishing (CMP) step followed by a reactive ion etch step. In this case, the overall resistance of the emitter is reduced by reducing the thickness of the polysilicon emitter 36. The resultant structure including the recessed polysilicon emitter 36' is shown in FIG. 4A.

Figure 4B:
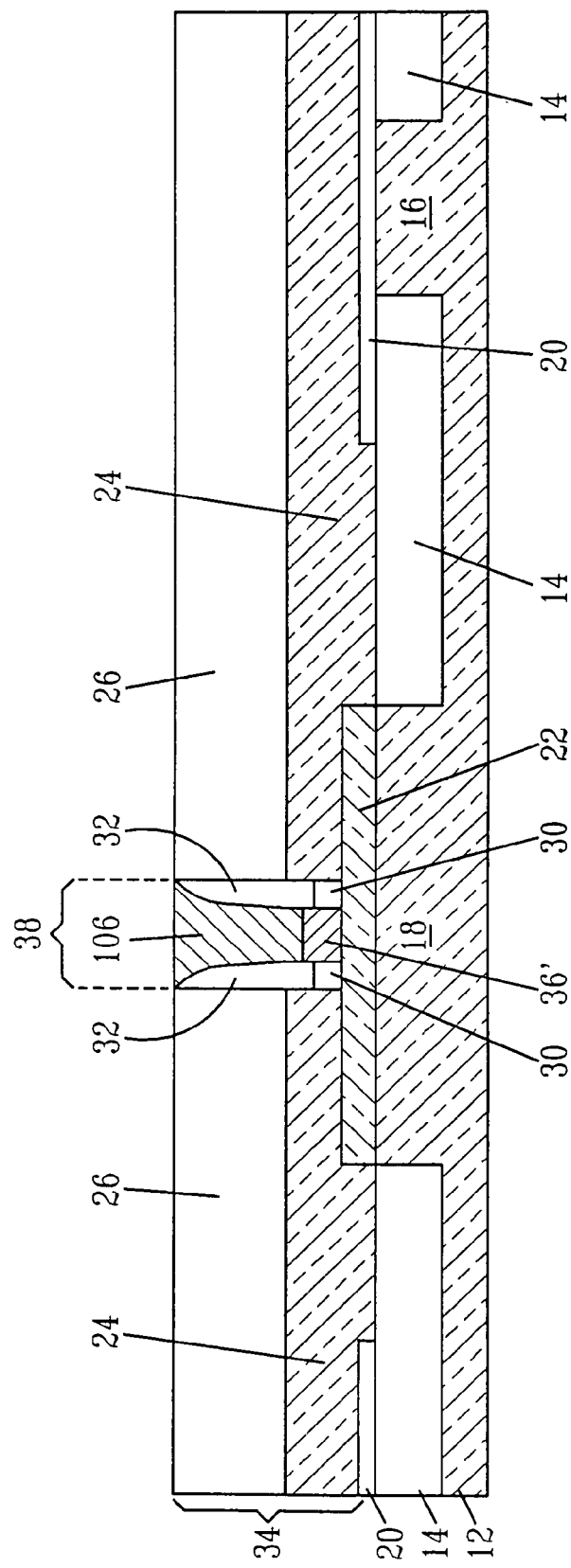

Next, a metal plug 106 is formed atop the recessed polysilicon emitter 36' by deposition and etching or CMP as shown in FIG. 4B. The metal plug is composed of the same or different metal as that used in forming the contacts shown in FIG. 2H.

Figure 4C:
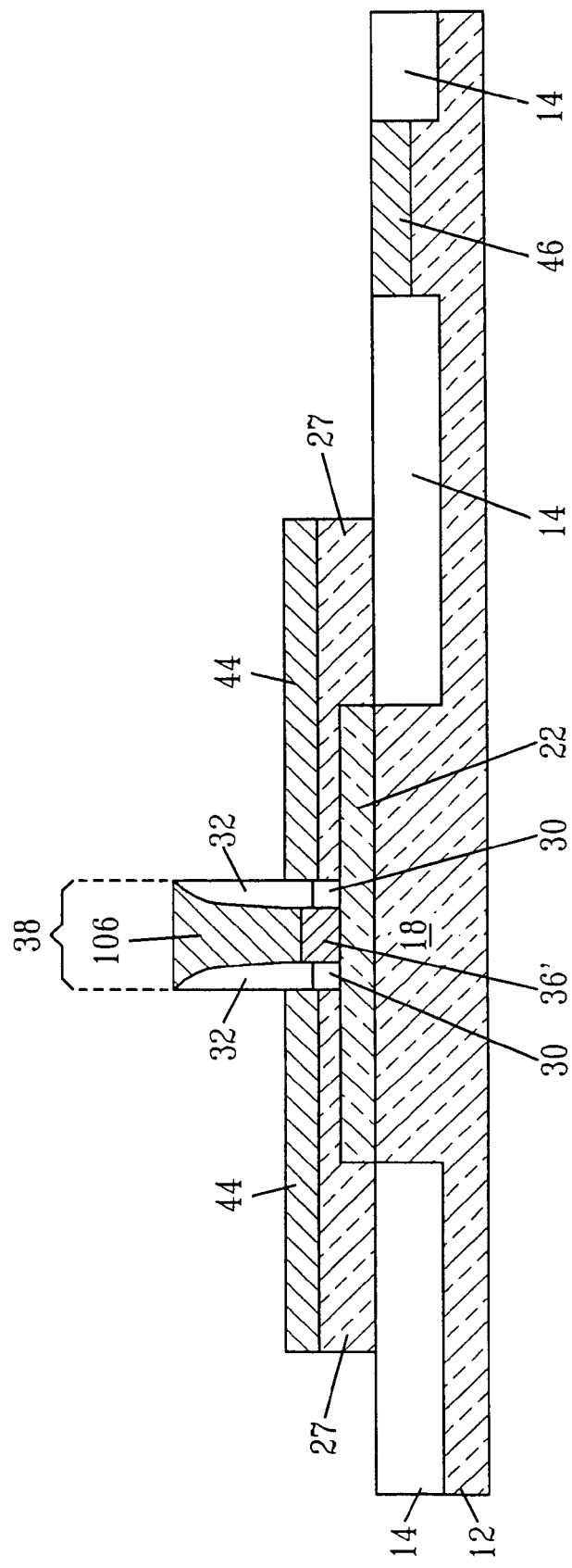

Following formation of the metal plug 106, the patterned dielectric layer 26 is removed and the extrinsic base layer 24 is patterned and removed with lithography and reactive ion etching over the dielectric layer 20 to define raised extrinsic base region 27. Thereafter, a self-aligned silicide layer 44 is formed atop the exposed extrinsic base region 27 as shown in FIG. 4C. Note that no silicide forms atop the block emitter polysilicon region 38 since that top layer is now composed of a metal rather than polysilicon as in the first embodiment (see FIG. 2F). As in the first embodiment, silicide layer 46 forms atop the collector reach-through region 16.

Figure 4D:
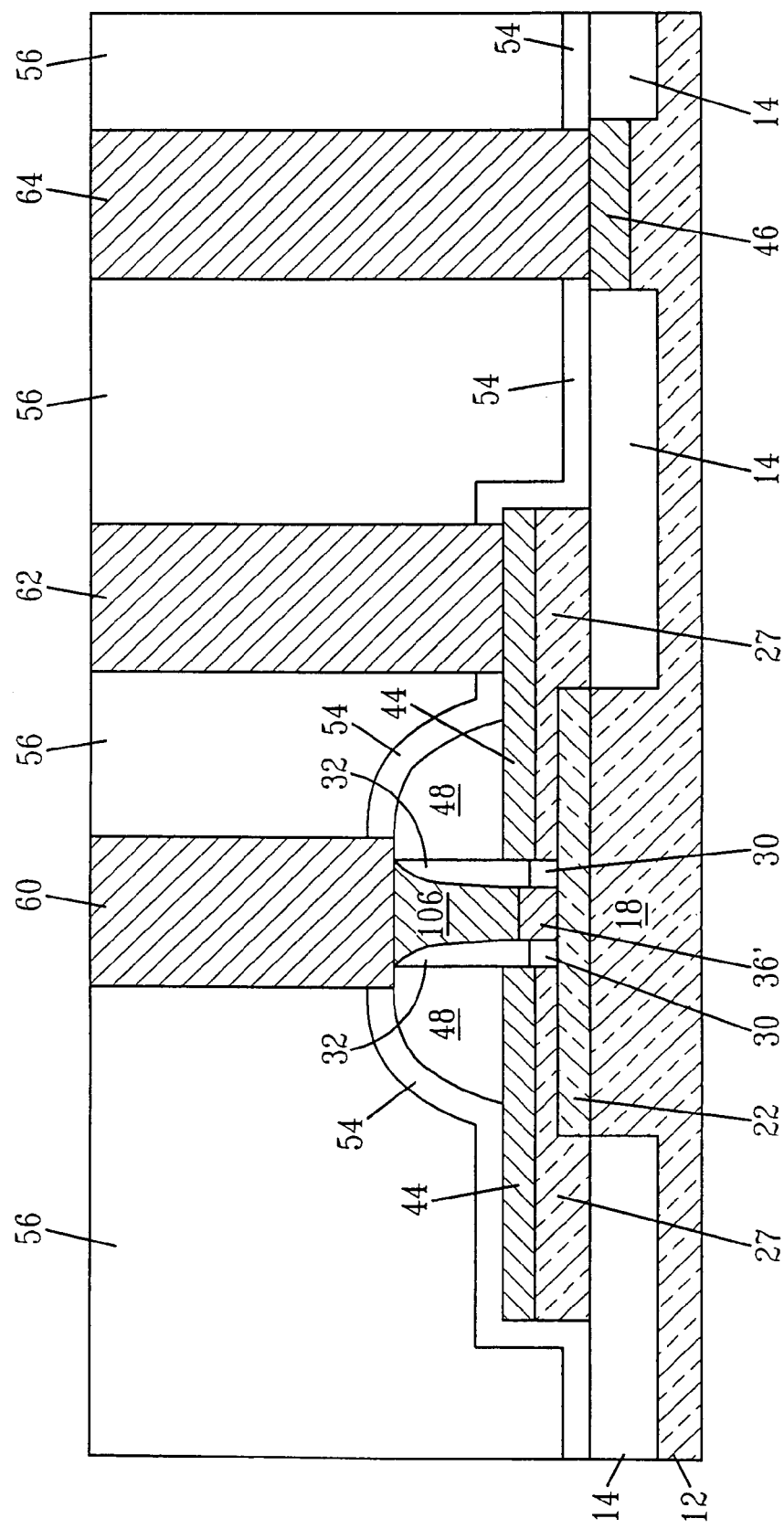

The remaining processing steps are the same as in the first embodiment (FIG. 2G and FIG. 2H). FIG. 4D shows the final bipolar transistor structure according to the third embodiment of the present invention. Specifically, FIG. 4D shows another bipolar transistor structure of the present invention. As shown, the bipolar transistor structure includes a base region comprising an intrinsic base region 22 and surrounding raised extrinsic base region 27. A block polysilicon emitter region 38 comprising a thin polysilicon emitter 36' and a metallic plug 106 is located atop and in contact with the base region; particularly the recessed polysilicon emitter 36' is in direct contact with the intrinsic base region 22. The recessed polysilicon emitter 36' is isolated from the raised extrinsic base regions by oxide 30 and spacer 32. Metal plug 106, which is located atop the recessed polysilicon emitter 36", is isolated from the raised extrinsic base region 27 by spacer 32. A silicide layer 44 is located on the raised extrinsic base region 27. An inner edge of the silicide layer 44 is self-aligned to the block polysilicon emitter region 38. The structure also includes an emitter contact border, which is in the form of a wide spacer 48, located atop the patterned raised extrinsic base region 27. The emitter contact border is self-aligned to the edge of the block polysilicon emitter region 38.

In the embodiment depicted in FIGS. 4A-4D, it is possible to replace the wide spacer with double spacer to form the emitter self-aligned contact border (see FIG. 3).

FIGS. 5A-5F show a fourth embodiment of the present invention. In the fourth embodiment, the polysilicon emitter 36 is replaced with a recessed polysilicon emitter 36' and a nitride plug 108 is used. In the drawings, the insulating spacer 32 is shown as nitride spacers; therefore there is no interface region shown between the plug and insulating spacer 32. In embodiments, in which the insulating spacer 32 is not composed of nitride, an interface would exist between the insulating spacer 32 and the nitride plug 108.

Figure 5A:
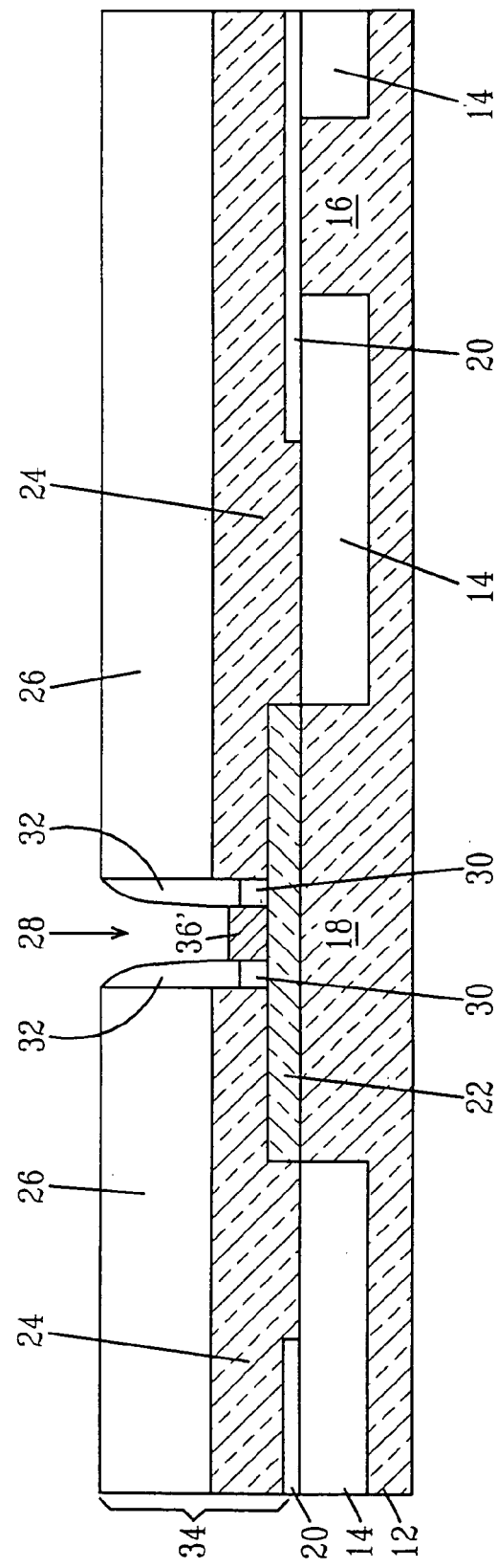
FIGS. 5A-5F are pictorial representations (through cross sectional views) illustrating a fourth embodiment of the present invention.
Figure 5B:
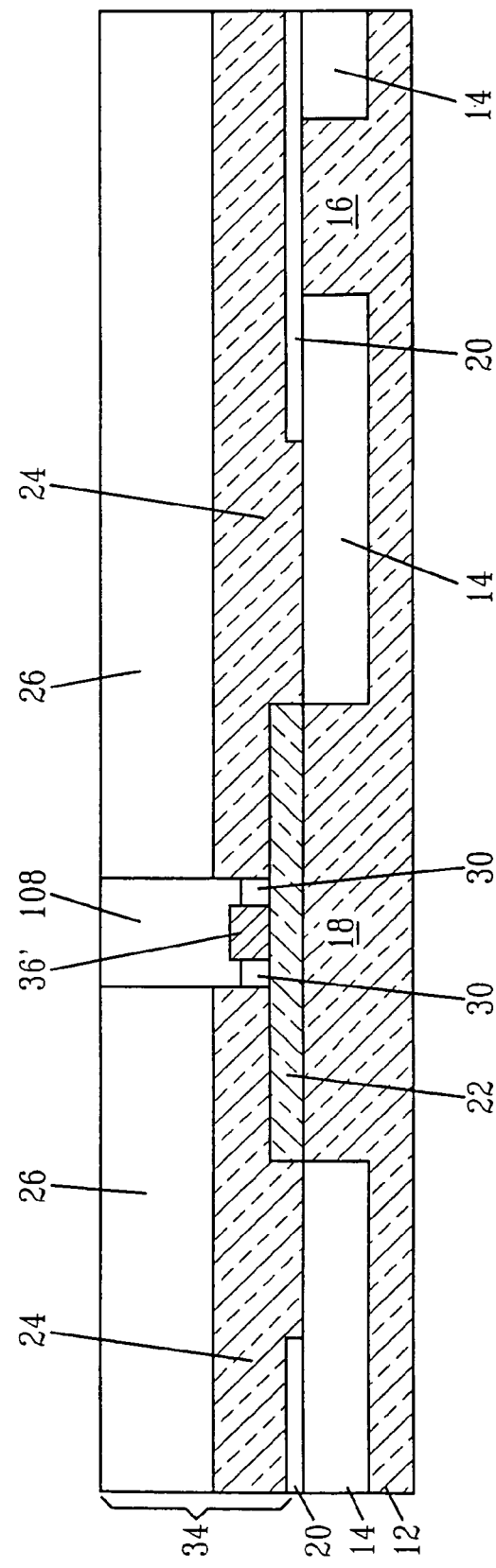

Reference is first made to FIG. 5A, which shows the structure including recessed polysilicon emitter 36'. The illustrated structure is fabricated as described above for FIG. 4A. Nitride plug 108 is then formed within the opening atop the recessed polysilicon emitter 36' by deposition and etch back or CMP providing the structure shown in FIG. 5B.

Figure 5C:
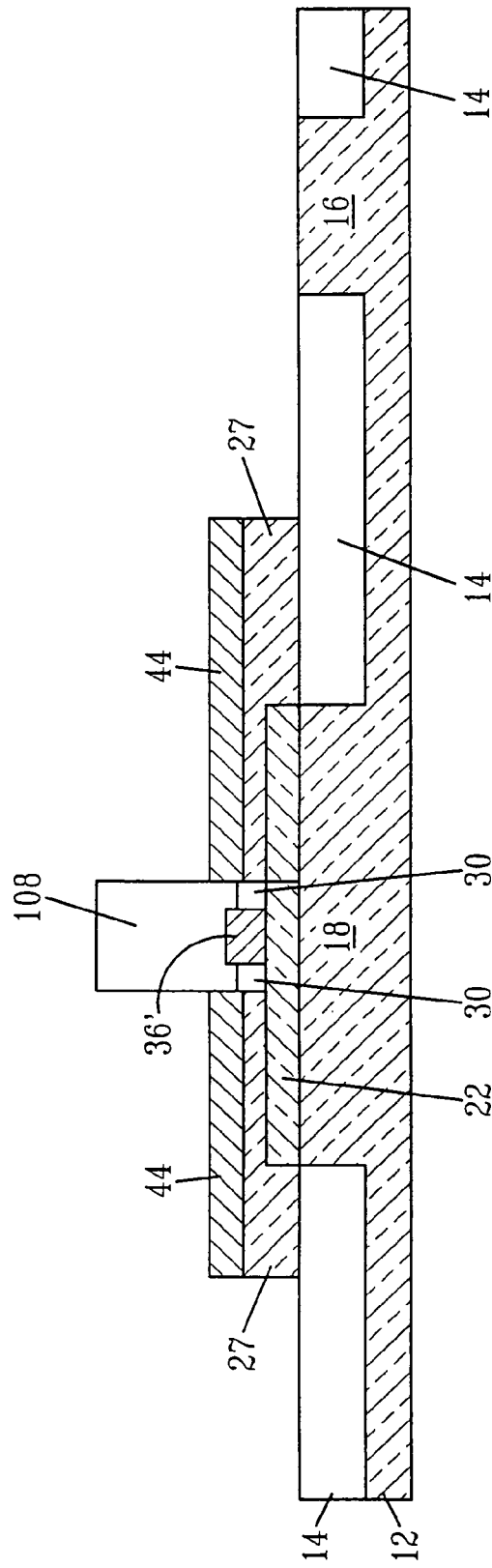

FIG. 5C shows the structure after removing the dielectric layer 26, patterning the extrinsic base layer 24 to form raised extrinsic base region 27, and formation of silicide layer 44 atop the raised extrinsic base region 27; silicide layer 46 is also formed atop the collector reach-through region 16 at this point of the present invention. No silicide is formed atop the nitride plug 108. Again, the silicide layer 44 that is formed atop the raised extrinsic base region 24 is self-aligned to the edge 40 of the block polysilicon emitter region 38.

Figure 5D:
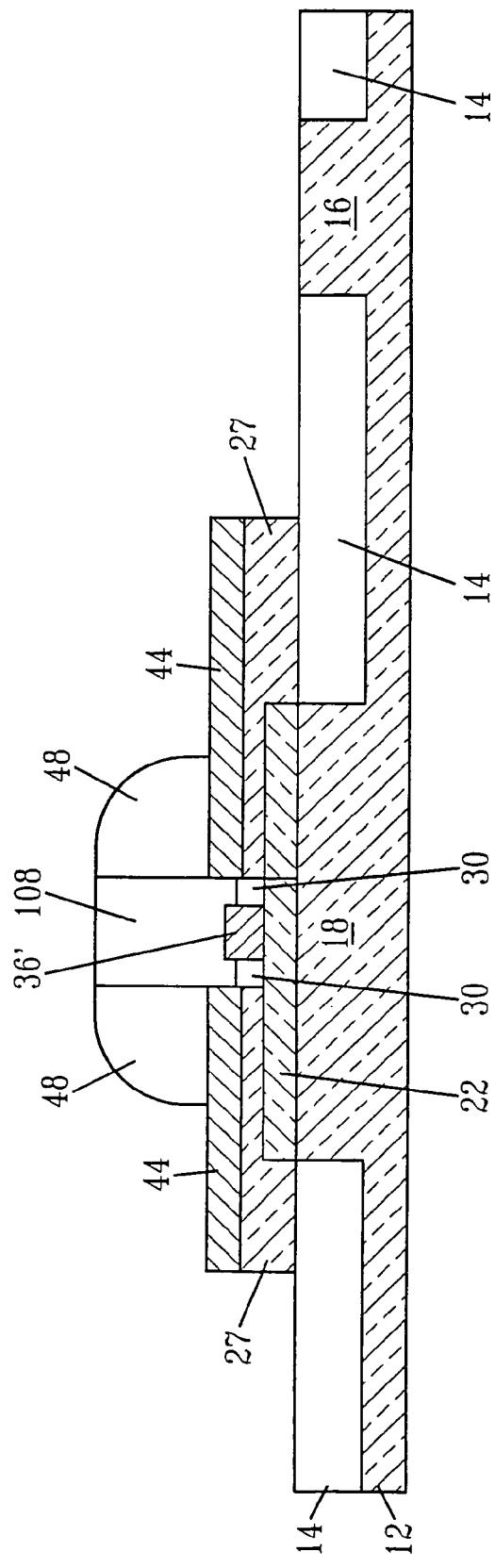
Figure 5E:
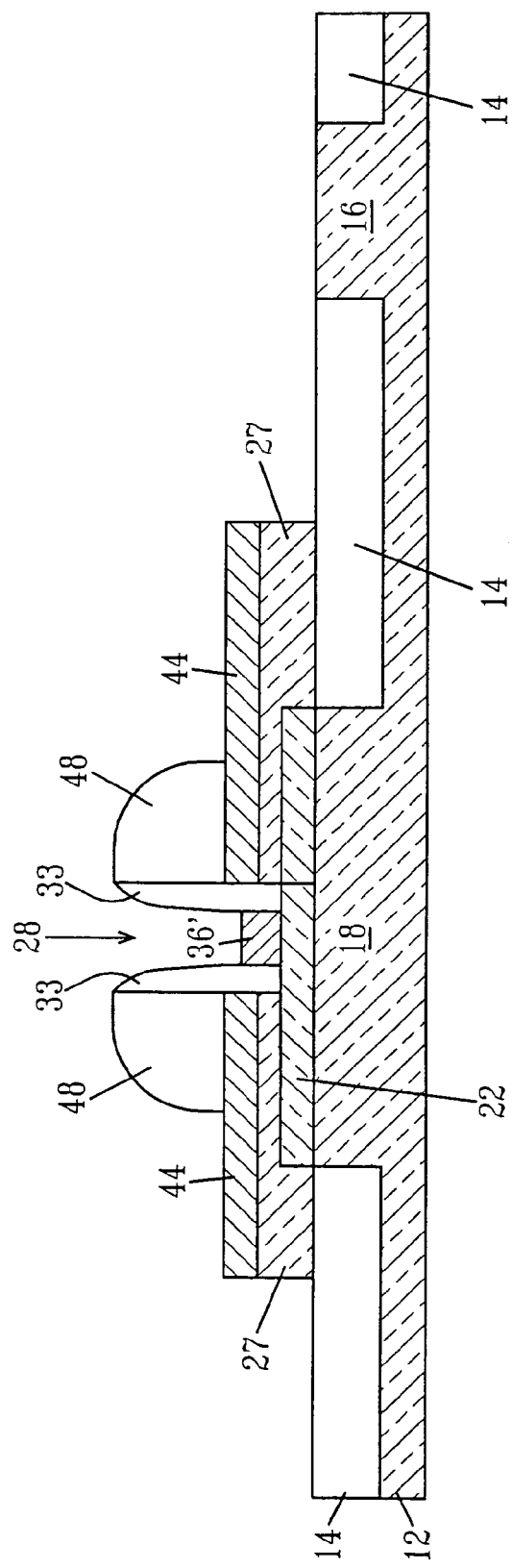

FIG. 5D shows the structure after wide spacer 48 formation. Although wide spacer 48 is shown, this embodiment also contemplates the use of double spacer. FIG. 5E shows the structure after removing the nitride plug 108, and if, present nitride spacers. When the insulating spacer 48 is not composed of nitride this removal step merely removes the nitride plug. The nitride plug and, if present, nitride spacer 32 are removed by an etching process that selectively removes nitride as compared to oxide and polysilicon. If not present, an annular oxide spacer 33 is formed within emitter opening 28 by deposition and etching to provide isolation between the extrinsic base region 27 and the polysilicon emitter 36'.

Figure 5F:
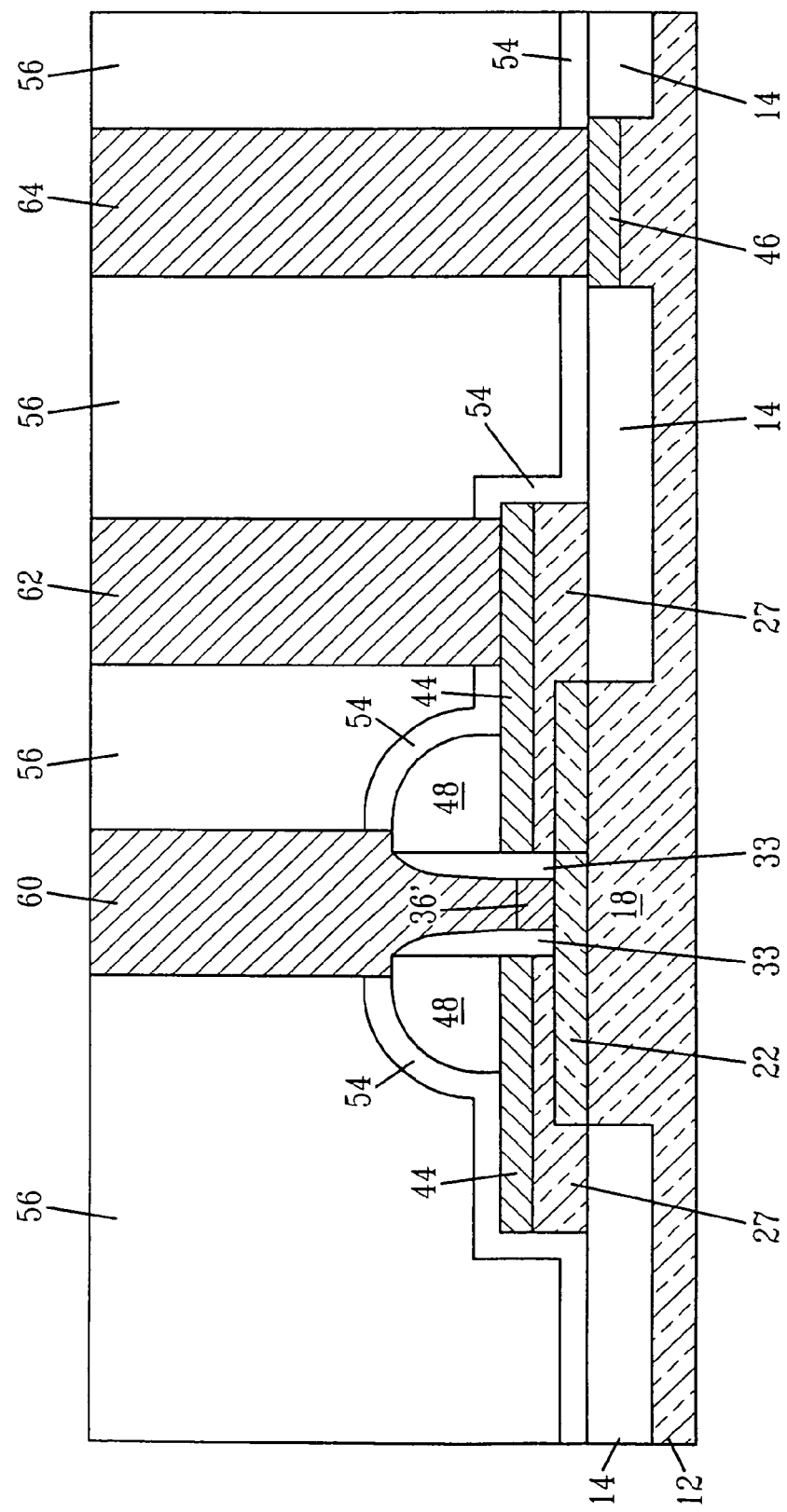

FIG. 5F shows the final structure including the various contacts mentioned above. The structure shown in FIG. 5F was made using the processing step mentioned above in connection with FIG. 2H. Specifically, FIG. 5F shows another bipolar transistor structure of the present invention. As shown, the bipolar transistor structure includes a base region comprising an intrinsic base region 22 and surrounding raised extrinsic base regions 27. A block polysilicon emitter region 38 comprising a thin polysilicon emitter 36' is located atop and in contact with the base region; particularly the recessed polysilicon emitter 36' is in direct contact with the intrinsic base region 22. The recessed polysilicon emitter 36' is isolated from the raised extrinsic base regions 27 by spacer 33. A silicide layer 44 is located on the raised extrinsic base region 27. An inner edge of the silicide layer 44 is self-aligned to the block polysilicon emitter region 38. The structure also includes an emitter contact border, which is in the form of a wide spacer 48, located atop the patterned raised extrinsic base region 27. The emitter contact border is self-aligned to the edge of the block polysilicon emitter region 38. In this embodiment, the emitter contact 60 is in contact with the upper surface of the recessed polysilicon emitter 36'.

Figure 6A:
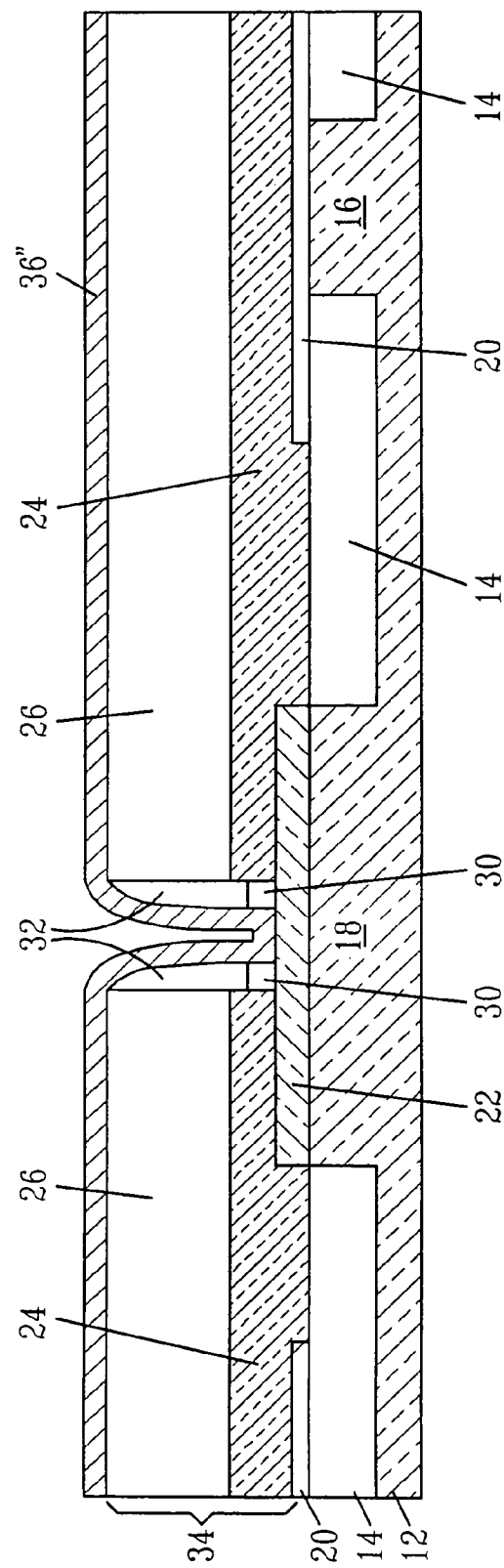
FIGS. 6A-6E are pictorial representations (through cross sectional views) illustrating a fifth embodiment of the present invention.
Figure 6B:
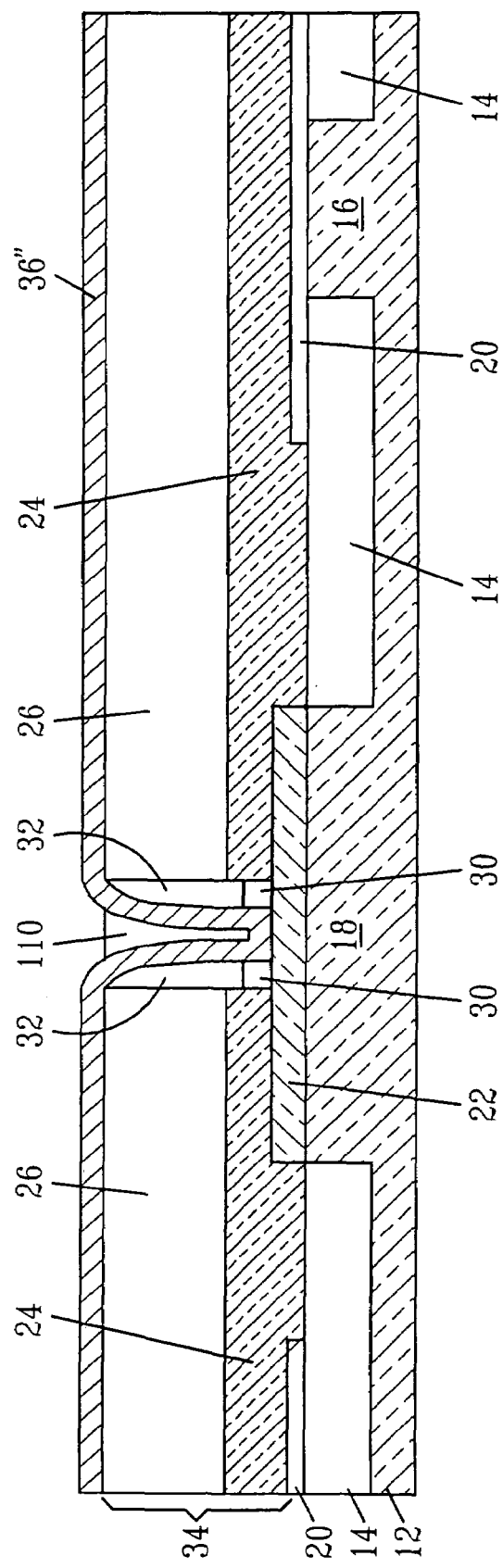

FIGS. 6A-6E illustrate a fifth embodiment of the present invention. In the fifth embodiment of the present invention, the block emitter polysilicon region 38 includes a conformal polysilicon emitter layer 36". FIG. 6A shows the structure after depositing a thin, conformal polysilicon emitter layer 36" to the structure shown in FIG. 2A. The thin, conformal polysilicon emitter layer 36" is formed by a conformal deposition process such as chemical vapor deposition. Next, an oxide plug 110 is formed in the opening by deposition and etch back or CMP providing the structure shown in FIG. 6B.

Figure 6C:
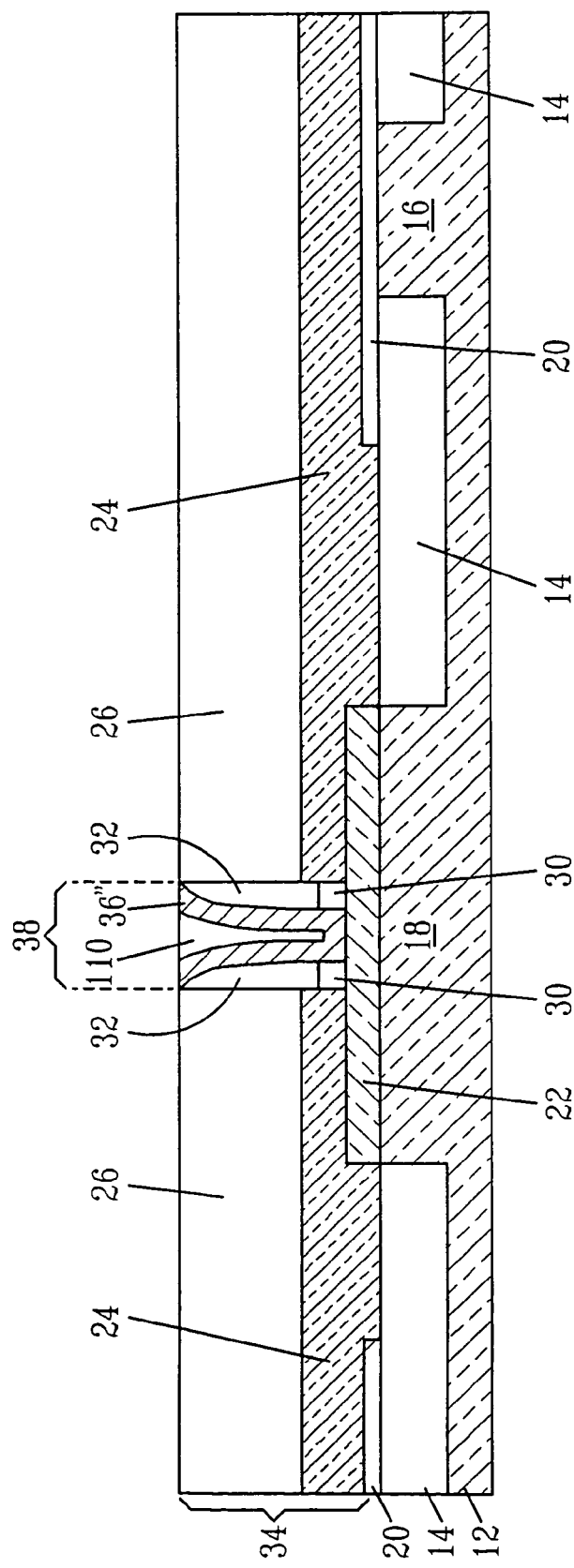

FIG. 6C shows the structure that is formed after the emitter polysilicon layer is removed in the field by an etch back or CMP process. Note that the block emitter polysilicon region 38 includes thin, conformal polysilicon emitter 36" and oxide plug 110.

Figure 6D:
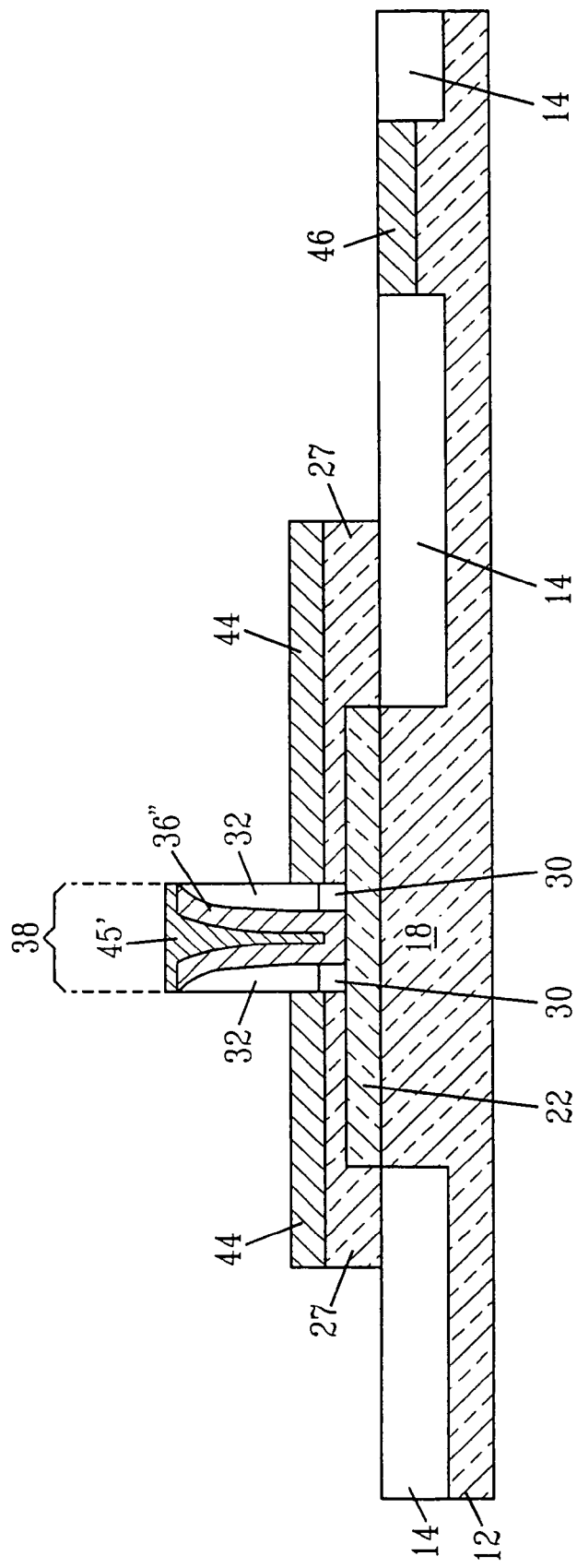

FIG. 6D shows the structure after removing the patterned dielectric layer 26 and oxide plug 110, patterning of the extrinsic base layer 24 to form raised extrinsic base region 27, and forming silicide layer 44 on top of raised extrinsic base region 27 and self-aligned silicide plug 45' inside block polysilicon emitter 38; silicide layer 46 also forms atop the collector reach-through region 16 at this point of the present invention. In this case, the overall resistance of the emitter is reduced by reducing thickness of the polysilicon emitter layer 36" and formation of silicide layer 45. The silicide layer 44 located atop the raised extrinsic base region 27 has an inner edge that is self-aligned to the edge of the block polysilicon region 38.

Figure 6E:
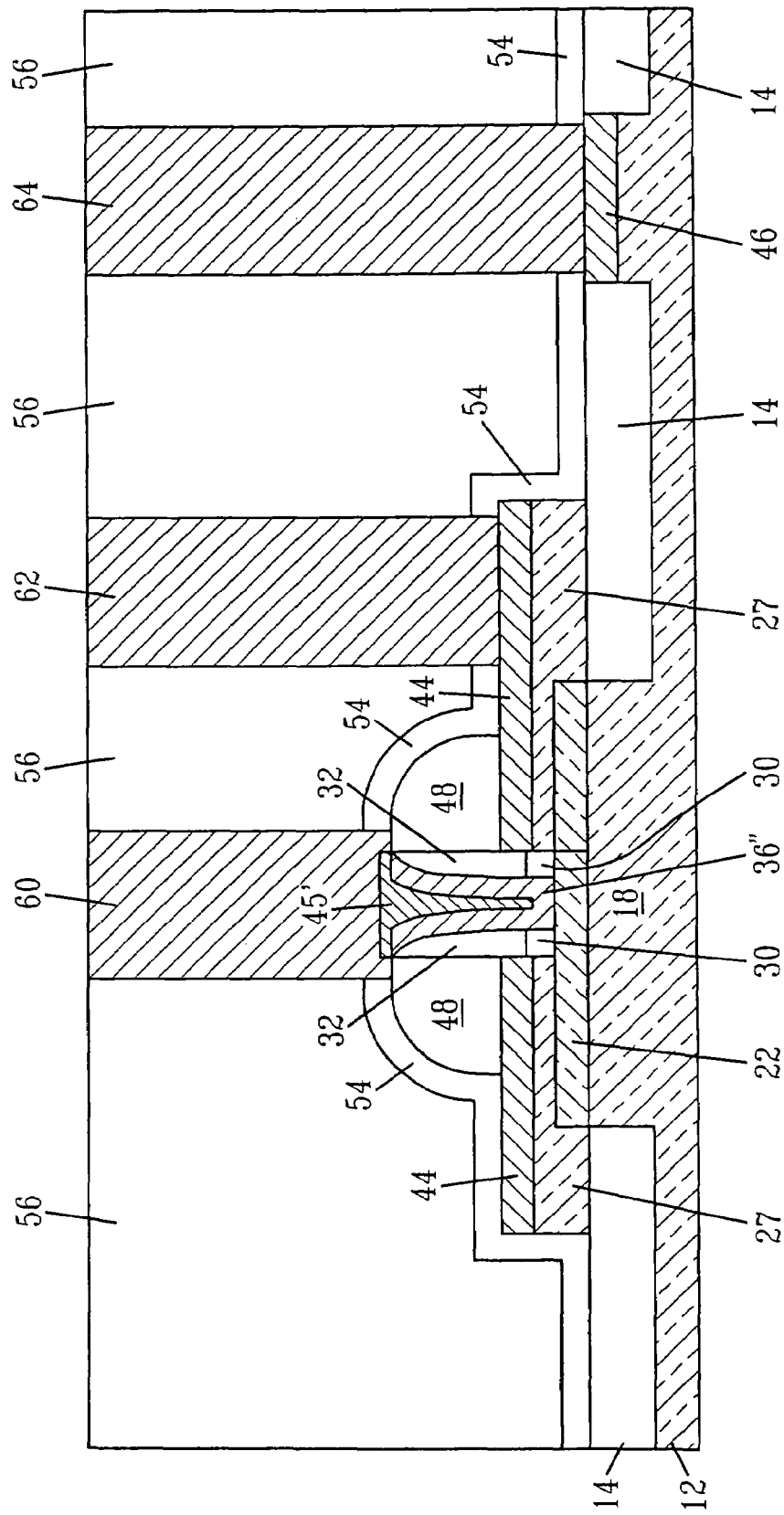

FIG. 6E shows the structure after formation of the self-aligned emitter contact border. In the embodiment shown, a wide spacer 48 is employed in forming the final structure. In addition to utilizing wide spacer 48, the present invention also contemplates embodiments in which a double spacer is employed in lieu of the wide spacer 48.

Specifically, FIG. 6E shows another bipolar transistor structure of the present invention. As shown, the bipolar transistor structure includes a base region comprising an intrinsic base region 22 and surrounding raised extrinsic base regions 27. A block polysilicon emitter region 38 comprising a thin conformal polysilicon emitter 36" and silicide plug 45' is located atop and in contact with the base region; particularly the conformal polysilicon emitter 36" is in direct contact with the intrinsic base region 22. The polysilicon emitter 36" is isolated from the raised extrinsic base regions 27 by oxide 30 and spacer 32. A silicide layer 44 is located on the raised extrinsic base region 27. An inner edge of the silicide layer 44 is self-aligned to the block polysilicon emitter region 38. The structure also includes an emitter contact border, which is in the form of a wide spacer 48, located atop the patterned raised extrinsic base region 27. The emitter contact border is self-aligned to the edge of the block polysilicon emitter region 38. The wide spacers 48 may be replaced by double spacer.

In each of the embodiments mentioned above in which double spacers are employed, the present invention also contemplates removing the outer spacer 102 and leaving inner L-shaped spacer 100 (see FIG. 3) prior to contact formation.

It should be noted that the height of the recessed polysilicon emitter 36' may vary from that which is specifically disclosed and described herein.

While the present invention has been particularly shown and described with respect to preferred embodiments, it will be understood by those skilled in the art that the foregoing and other changes in forms and details may be made without departing from the spirit and scope of the present invention. It is therefore intended that the present invention not be limited to the exact forms and details described and illustrates, but fall within the scope of the appended claims.

What is claimed is:

1. A bipolar transistor comprising:
 a base region comprising an intrinsic base region and surrounding raised extrinsic base regions;
 a block polysilicon emitter region located atop and in contact with said intrinsic base region, the block polysilicon emitter region including a polysilicon emitter and a spacer having a planar outermost edge normal to a surface of the intrinsic base region;
 a silicide layer located on the raised extrinsic base region, said silicide layer having an inner edge that is aligned to the planar outermost edge of the spacer of the block polysilicon emitter region, wherein the inner edge of the silicide layer abuts the planar outermost edge of the spacer; and
 an emitter contact border located atop the raised extrinsic base region, wherein an inner edge of the emitter contact border is vertically aligned to both of the inner edge of the silicide layer and an inner edge of the raised extrinsic base region that is abutting the spacer having the planar outmost edge of the block polysilicon emitter region.

2. The bipolar transistor of claim 1 wherein the polysilicon emitter has an upper surface recessed below an upper surface of the spacer at a center region of the polysilicon emitter, wherein a metallic plug is positioned atop the polysilicon emitter.

3. The bipolar transistor of claim 1 wherein the block polysilicon emitter region is in contact with an overlying emitter contact.

4. The bipolar transistor of claim 1 wherein one side of the emitter contact border is defined by the spacer of the polysilicon emitter region.

5. The bipolar transistor of claim 4 wherein the spacer provides isolation between said base region and the polysilicon emitter of the block polysilicon emitter region.

6. The bipolar transistor of claim 1 wherein the spacer defines the emitter's final dimension and provides lateral emitter-base isolation.

7. The bipolar transistor of claim 1 further comprising an emitter contact located directly atop the emitter contact border and the block polysilicon emitter region.

8. The bipolar transistor of claim 7 wherein the emitter contact has a dimension that is larger than a dimension of block polysilicon emitter region.

9. The bipolar transistor of claim 1 further comprising a base contact located directly atop the raised extrinsic base region.

10. The bipolar transistor of claim 1 further comprising a collector reach-through region located in a surface of a Si-containing substrate that underlies said transistor.

11. The bipolar transistor of claim 10 wherein the collector reach-through region is silicided.

12. The bipolar transistor of claim 11 further comprising a collector contact atop said silicided collector reach-through region.

* * * * *

UNITED STATES PATENT AND TRADEMARK OFFICE
CERTIFICATE OF CORRECTION

| | | |
|---|---|---|
| PATENT NO. | : 7,466,010 B2 | Page 1 of 1 |
| APPLICATION NO. | : 11/175094 | |
| DATED | : December 16, 2008 | |
| INVENTOR(S) | : David C. Ahlgren et al. | |

It is certified that error appears in the above-identified patent and that said Letters Patent is hereby corrected as shown below:

Col. 1, Line 5 should read

--Notice of Government Rights
This invention was made with Government support under N6601-02-C-8014 awarded by DARPA.
The Government has certain rights in this invention.--

Signed and Sealed this
Eleventh Day of September, 2012

David J. Kappos
*Director of the United States Patent and Trademark Office*